US012638520B2

(12) United States Patent
Kawamori et al.

(10) Patent No.: US 12,638,520 B2
(45) Date of Patent: *May 26, 2026

(54) MAGNETIC SENSOR

(71) Applicant: TDK CORPORATION, Tokyo (JP)

(72) Inventors: Keita Kawamori, Tokyo (JP); Hiraku Hirabayashi, Tokyo (JP); Hiromichi Umehara, Tokyo (JP)

(73) Assignee: TDK CORPORATION, Tokyo (JP)

( * ) Notice: Subject to any disclaimer, the term of this patent is extended or adjusted under 35 U.S.C. 154(b) by 12 days.

This patent is subject to a terminal disclaimer.

(21) Appl. No.: 18/751,629

(22) Filed: Jun. 24, 2024

(65) Prior Publication Data

US 2024/0345187 A1 Oct. 17, 2024

Related U.S. Application Data

(63) Continuation of application No. 17/947,564, filed on Sep. 19, 2022, now Pat. No. 12,105,163.

(Continued)

(30) Foreign Application Priority Data

Sep. 1, 2022 (JP) ................................. 2022-139176

(51) Int. Cl.
*G01R 33/09* (2006.01)

(52) U.S. Cl.
CPC .................................... *G01R 33/09* (2013.01)

(58) Field of Classification Search
CPC ..................................................... G01R 33/09
See application file for complete search history.

(56) References Cited

U.S. PATENT DOCUMENTS 6,327,107 B1 12/2001 Komuro
9,176,204 B2 11/2015 Kobayashi et al.
(Continued)

FOREIGN PATENT DOCUMENTS

CN 101142494 A 3/2008
DE 102020130296 A1 6/2021
(Continued)

OTHER PUBLICATIONS

Translation of Nov. 15, 2025 Office Action issued in Chinese Patent Application No. 202211142397.9.

(Continued)

*Primary Examiner* — Walter L Lindsay, Jr.
*Assistant Examiner* — Milton Gonzalez
(74) *Attorney, Agent, or Firm* — Oliff PLC

(57) ABSTRACT

A magnetic sensor includes an insulating layer, a coil element disposed on the insulating layer, and a first insulating film. The insulating layer includes a first inclined surface and a second inclined surface. The coil element includes a first side surface and a second side surface. The first side surface includes a first portion and a second portion, the second portion being disposed at a position farther from a top surface of a substrate than a position where the first portion is disposed. The first portion is inclined so as to intersect with the first and second inclined surfaces, and is also inclined so as to be closer to the second side surface at positions closer to the top surface of the substrate. The first insulating film covers the first portion.

15 Claims, 13 Drawing Sheets

Related U.S. Application Data

(60) Provisional application No. 63/246,428, filed on Sep. 21, 2021.

(56) References Cited

U.S. PATENT DOCUMENTS

| | | |
|---|---|---|
| 2002/0006020 A1 | 1/2002 | Hasegawa |
| 2003/0218256 A1 | 11/2003 | Merchant et al. |
| 2004/0051996 A1 | 3/2004 | Kautzky et al. |
| 2006/0176142 A1 | 8/2006 | Naito et al. |
| 2006/0261425 A1 | 11/2006 | Suemitsu |
| 2007/0067983 A1 | 3/2007 | Morita et al. |
| 2008/0169807 A1 | 7/2008 | Naito et al. |
| 2009/0067098 A1 | 3/2009 | Kim et al. |
| 2021/0156933 A1 | 5/2021 | Makino |
| 2021/0181240 A1 | 6/2021 | Ota et al. |
| 2021/0405132 A1* | 12/2021 | Kubota .................. G01R 33/09 |

FOREIGN PATENT DOCUMENTS

| | | |
|---|---|---|
| JP | 11-316919 A | 11/1999 |
| JP | 2001-56908 A | 2/2001 |
| JP | 2002-33532 A | 1/2002 |
| JP | 2003-110163 A | 4/2003 |
| JP | 2004-128229 A | 4/2004 |
| JP | 2005-340715 A | 12/2005 |
| JP | 2018-073995 A | 5/2018 |
| JP | 2021-85738 A | 6/2021 |
| WO | 2016/021260 A1 | 2/2016 |

OTHER PUBLICATIONS

U.S. Appl. No. 19/274,044, filed Jul. 18, 2025 in the name of Hidekazu Kojima.

Translation of Jan. 27, 2026 Office Action issued in Japanese Application No. 2022-139173.

* cited by examiner

20

30

MAGNETIC SENSOR

CROSS REFERENCE TO RELATED APPLICATIONS

This application is a continuation of U.S. application Ser. No. 17/947,564, filed on Sep. 19, 2022, and issued as U.S. Pat. No. 12,105,163 on Oct. 1, 2024, which claims the benefit of U.S. Provisional Patent Application No. 63/246, 428 filed on Sep. 21, 2021, and Japanese Priority Patent Application No. 2022-139176 filed on Sep. 1, 2022, the entire contents of each of which are incorporated herein by their reference.

BACKGROUND

The technology relates to a magnetic sensor including a metal layer disposed on an inclined surface.

Magnetic sensors using magnetoresistive elements have been used for various applications in recent years. A system including a magnetic sensor may be intended to detect a magnetic field containing a component in a direction perpendicular to the surface of a substrate by using a magnetoresistive element provided on the substrate. In such a case, the magnetic field containing the component in the direction perpendicular to the surface of the substrate can be detected by providing a soft magnetic body for converting a magnetic field in the direction perpendicular to the surface of the substrate into a magnetic field in the direction parallel to the surface of the substrate or locating the magnetoresistive element on an inclined surface formed on the substrate.

U.S. Patent Application Publication No. 2006/0176142 A1 discloses a magnetic sensor including magnetoresistive elements each formed on an inclined surface. In the magnetic sensor, a surface of a substrate on which the magnetoresistive elements are provided is covered with a protective film of an insulating material.

By the way, in magnetic sensors, coils may be provided for various applications. For example, International Publication No. 2016/021260 discloses a magnetic sensor including a coil through which a constant current to be measured flows, and a magnetic balance type current sensor including such a magnetic sensor and a feedback coil. In the magnetic sensor disclosed in International Publication No. 2016/021260, the coil is formed on a plane above a magnetic measurement element.

Herein, regarding a magnetic sensor including magnetoresistive elements each formed on an inclined surface like the magnetic sensor disclosed in U.S. Patent Application Publication No. 2006/0176142 A1, a case is considered where a coil is provided at a position above and close to each magnetoresistive element like the magnetic sensor disclosed in International Publication No. 2016/021260. In such a case, an insulating layer with an almost constant thickness is provided between the magnetoresistive element and the coil. The insulating layer includes an inclined surface with a shape corresponding to the inclined surface on which the magnetoresistive element is disposed. The coil is also formed on the inclined surface of the insulating layer. Typically, the coil is formed to have a rectangular cross section. However, there may be a case where at least a part of the coil does not have a rectangular cross section due to influence of the inclined surface of the insulating layer. For example, there may be a case where at least a part of the coil has an inverted trapezoidal cross section such that the width of the coil becomes smaller at positions closer to a bottom surface of the coil.

Typically, a surface of a coil is covered with a protective film of an insulating material. In a case where the coil has an inverted trapezoidal cross section as described above, the protective film is less easily attached to a portion near a bottom surface of the coil than to a portion near a top surface of the coil. Consequently, a seam, which is formed during deposition of the protective film, is present at a position closer to the coil. If such a seam is present near the coil, a problem would arise such that the coil corrodes due to a resist removing solution or the like that has entered through the seam.

The foregoing problem is true of not only the coil but also a wire and the like formed on an inclined surface.

SUMMARY

A magnetic sensor according to one embodiment of the technology includes a substrate including a reference plane, a magnetic detection element and an insulating layer provided on the substrate, and at least one metal layer and a plurality of first insulating films disposed on the insulating layer. The insulating layer includes at least one inclined surface inclined with respect to the reference plane. The at least one metal layer has a shape that is long in a predetermined direction, and includes a first side surface and a second side surface located on both sides in a short-side direction of the at least one metal layer. Each of the first side surface and the second side surface includes a first portion and a second portion, the second portion being disposed at a position farther from the reference plane than a position where the first portion is disposed. The first portion is inclined so as to intersect with the at least one inclined surface. The first portion of the first side surface is further inclined so as to be closer to the second side surface at positions closer to the reference plane. The first portion of the second side surface is further inclined so as to be closer to the first side surface at positions closer to the reference plane. The plurality of first insulating films include a portion covering the first portion of the first side surface and extending in a direction intersecting with the at least one inclined surface, and a portion covering the first portion of the second side surface and extending in a direction intersecting with the at least one inclined surface.

In the magnetic sensor according to one embodiment of the technology, the plurality of first insulating films cover the first portion of the first side surface and the first portion of the second side surface. Thereby, according to one embodiment of the technology, corrosion of the metal layer disposed on the inclined surface can be prevented.

Other and further objects, features and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
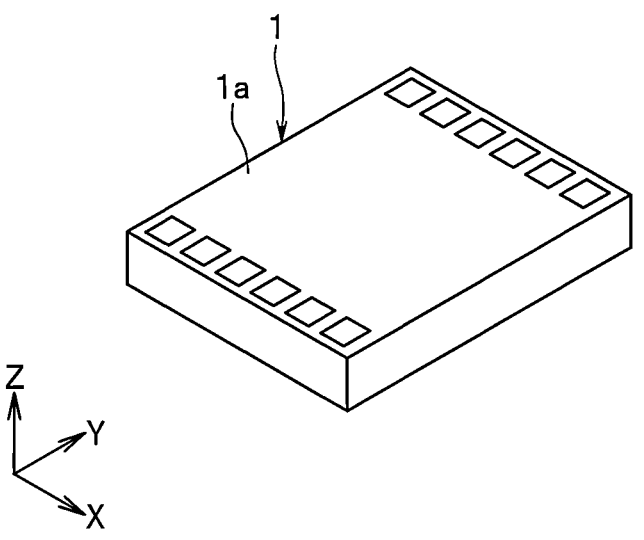
FIG. 1 is a perspective view showing a magnetic sensor according to a first example embodiment of the technology.

An object of the technology is to provide a magnetic sensor in which corrosion of a metal layer disposed on an inclined surface can be prevented.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

Figure 2:
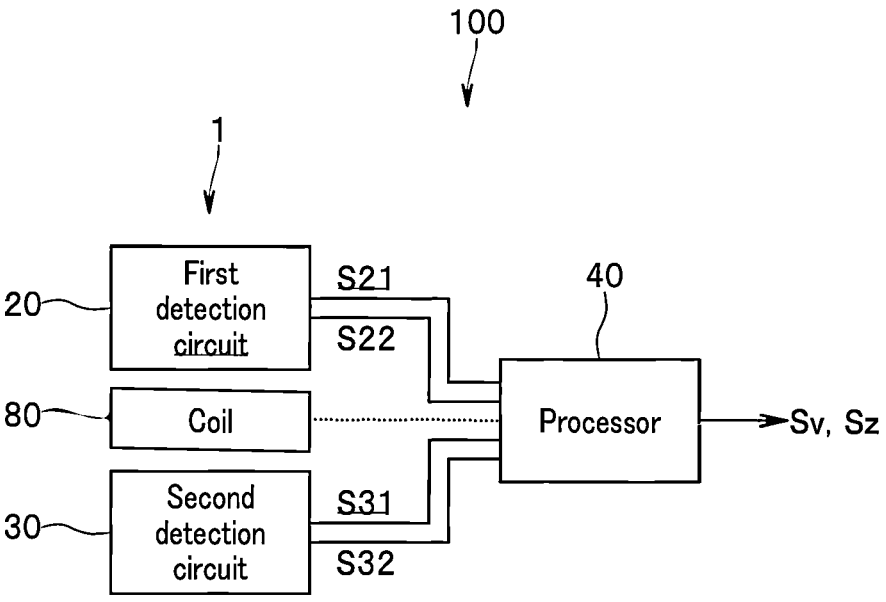
FIG. 2 is a functional block diagram showing a configuration of a magnetic sensor device including the magnetic sensor according to the first example embodiment of the technology.

First, a configuration of a magnetic sensor according to a first example embodiment of the technology will be described with reference to FIGS. 1 and 2. FIG. 1 is a perspective view showing a magnetic sensor according to the example embodiment. FIG. 2 is a functional block diagram showing a configuration of a magnetic sensor device including the magnetic sensor according to the example embodiment.

As shown in FIG. 1, the magnetic sensor 1 is in the form of a chip having a rectangular parallelepiped shape. The magnetic sensor 1 includes a top surface 1a and a bottom surface located opposite to each other and also includes four side surfaces connecting the top surface 1a to the bottom surface. The magnetic sensor 1 also includes a plurality of electrode pads disposed on the top surface 1a.

Now, a description will be given of a reference coordinate system in the present example embodiment with reference to FIG. 1. The reference coordinate system is an orthogonal coordinate system that is set with reference to a magnetic sensor 1 and defined by three axes. An X direction, a Y direction, and a Z direction are defined in the reference coordinate system. The X, Y, and Z directions are orthogonal to each other. In particular, in the example embodiment, a direction that is perpendicular to the top surface 1a of the magnetic sensor 1 and is oriented from the bottom surface to the top surface 1a of the magnetic sensor 1 is defined as the Z direction. The opposite directions to the X, Y, and Z directions will be expressed as −X, −Y, and −Z directions, respectively. The three axes defining the reference coordinate system are an axis parallel to the X direction, an axis parallel to the Y direction, and an axis parallel to the Z direction.

Hereinafter, the term "above" refers to positions located forward of a reference position in the Z direction, and "below" refers to positions opposite from the "above" positions with respect to the reference position. For each component of the magnetic sensor 1, the term "top surface" refers to a surface of the component located at the end thereof in the Z direction, and "bottom surface" refers to a surface of the component located at the end thereof in the −Z direction. The phrase "when seen in the Z direction" means that an object is seen from a position at a distance in the Z direction.

As shown in FIG. 2, the magnetic sensor 1 includes a first detection circuit 20 and a second detection circuit 30. Each of the first and second detection circuits 20 and 30 includes a plurality of magnetic detection elements, and is configured to detect a target magnetic field to generate at least one detection signal. In particular, in the example embodiment, the plurality of magnetic detection elements are a plurality of magnetoresistive elements. The magnetoresistive elements will hereinafter be referred to as MR elements.

A plurality of detection signals generated by the first and second detection circuits 20 and 30 are processed by a processor 40. The magnetic sensor 1 and the processor 40 constitute a magnetic sensor device 100. The processor 40 is configured to, by processing the plurality of detection signals generated by the first and second detection circuits 20 and 30, generate a first detection value and a second detection value respectively having correspondences with components of a magnetic field in two different directions at a predetermined reference position. In particular, in the present example embodiment, the foregoing two different directions are a direction parallel to an XY plane and a direction parallel to the Z direction. For example, the processor 40 is constructed of an application-specific integrated circuit (ASIC).

The processor 40 may be included in a support supporting the magnetic sensor 1, for example. The support includes a plurality of electrode pads. The first and second detection circuits 20 and 30 are connected to the processor 40 via the plurality of electrode pads of the magnetic sensor 1, the plurality of electrode pads of the support, and a plurality of bonding wires, for example. In a case where the plurality of electrode pads of the magnetic sensor 1 are provided on the top surface 1a of the magnetic sensor 1, the magnetic sensor 1 may be mounted on the top surface of the support in such a posture that the bottom surface of the magnetic sensor 1 faces the top surface of the support.

Figure 3:
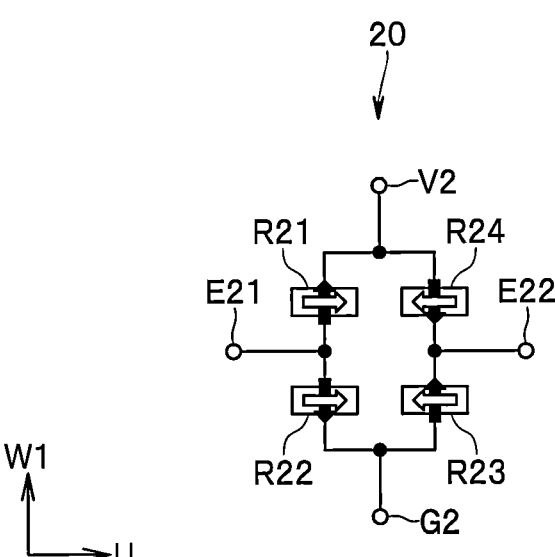
FIG. 3 is a circuit diagram showing a circuit configuration of a first detection circuit of the first example embodiment of the technology.
Figure 4:
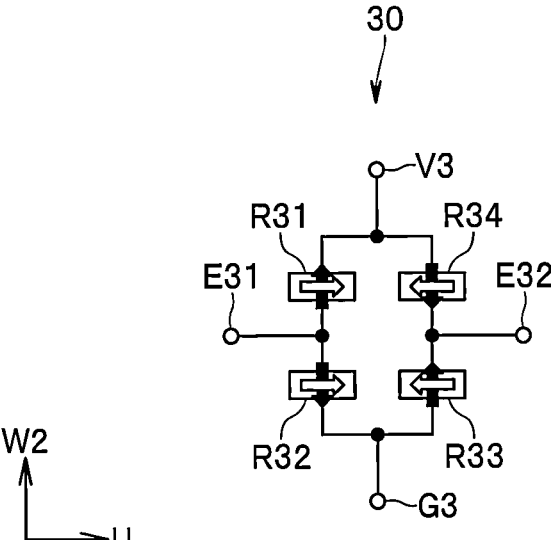
FIG. 4 is a circuit diagram showing a circuit configuration of a second detection circuit of the first example embodiment of the technology.
Figure 5:
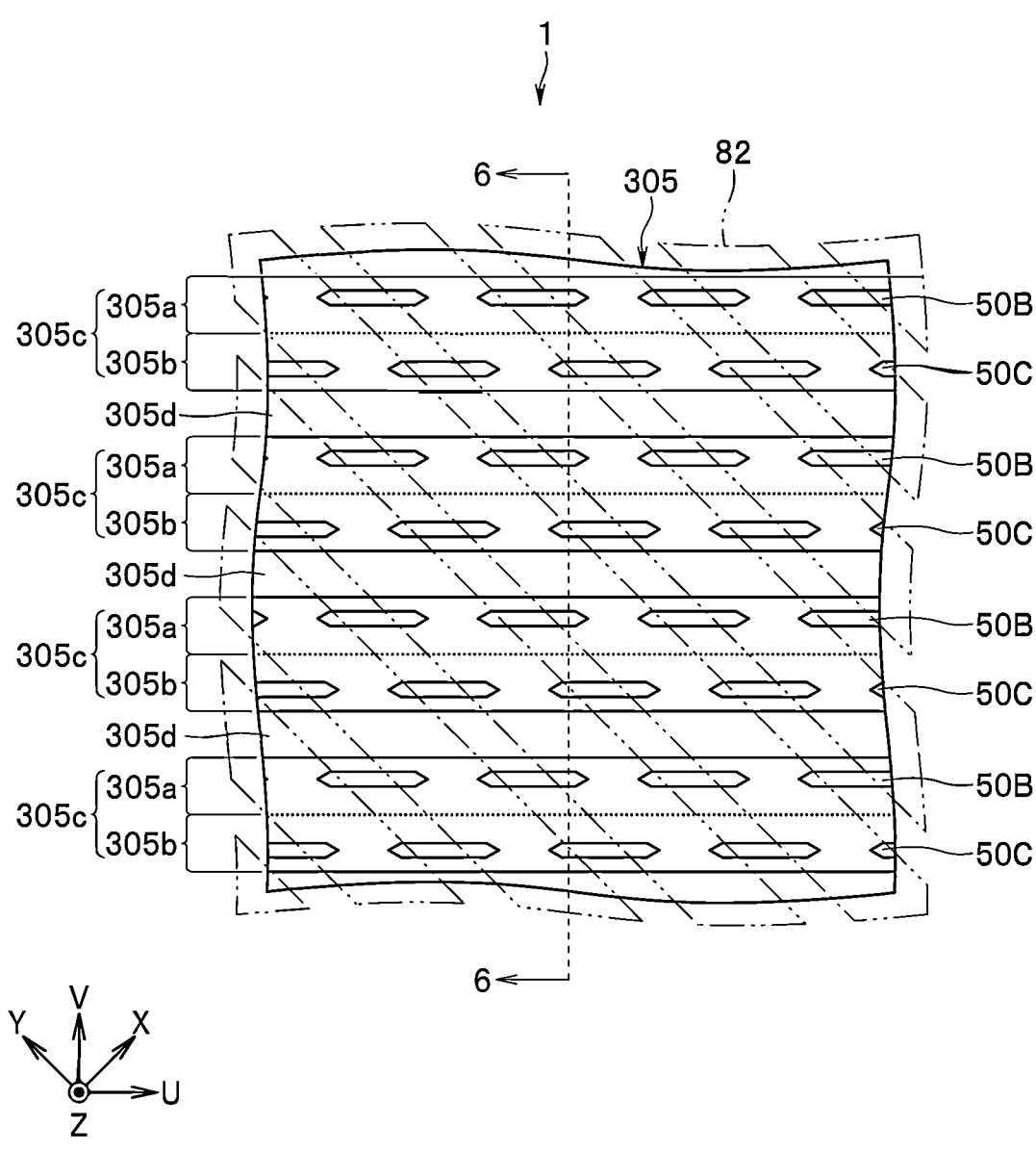
FIG. 5 is a plan view showing a part of the magnetic sensor according to the first example embodiment of the technology.
Figure 6:
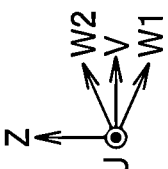
FIG. 6 is a sectional view showing a part of the magnetic sensor according to the first example embodiment of the technology.

Next, the first and second detection circuits 20 and 30 will be described with reference to FIGS. 3 to 6. FIG. 3 is a circuit diagram showing a circuit configuration of the first detection circuit 20. FIG. 4 is a circuit diagram showing a circuit configuration of the second detection circuit 30. FIG. 5 is a plan view showing a part of the magnetic sensor 1. FIG. 6 is a sectional view showing a part of the magnetic sensor 1.

Here, as shown in FIG. 5, a U direction and a V direction are defined as follows. The U direction is a direction rotated from the X direction to the –Y direction. The V direction is a direction rotated from the Y direction to the X direction. More specifically, in the present example embodiment, the U direction is set to a direction rotated from the X direction to the –Y direction by α, and the V direction is set to a direction rotated from the Y direction to the X direction by α. Note that α is an angle greater than 0° and smaller than 90°. For example, α is 45°. –U direction refers to a direction opposite to the U direction, and –V direction refers to a direction opposite to the V direction.

As shown in FIG. 6, a W1 direction and a W2 direction are defined as follows. The W1 direction is a direction rotated from the V direction to the –Z direction. The W2 direction is a direction rotated from the V direction to the Z direction. More specifically, in the present example embodiment, the W1 direction is set to a direction rotated from the V direction to the –Z direction by β, and the W2 direction is set to a direction rotated from the V direction to the Z direction by β. Note that β is an angle greater than 0° and smaller than 90°. –W1 direction refers to a direction opposite to the W1 direction, and –W2 direction refers to a direction opposite to the W2 direction. The W1 direction and W2 direction both are orthogonal to the U direction.

The first detection circuit 20 is configured to detect a component of the target magnetic field in a direction parallel to the W1 direction and generate at least one first detection signal which has a correspondence with the component. The second detection circuit 30 is configured to detect a component of the target magnetic field in a direction parallel to the W2 direction and generate at least one second detection signal which has a correspondence with the component.

As shown in FIG. 3, the first detection circuit 20 includes a power supply port V2, a ground port G2, signal output ports E21 and E22, a first resistor section R21, a second resistor section R22, a third resistor section R23, and a fourth resistor section R24. The plurality of MR elements of the first detection circuit 20 constitute the first to fourth resistor sections R21, R22, R23, and R24.

The first resistor section R21 is provided between the power supply port V2 and the signal output port E21. The second resistor section R22 is provided between the signal output port E21 and the ground port G2. The third resistor section R23 is provided between the signal output port E22 and the ground port G2. The fourth resistor section R24 is provided between the power supply port V2 and the signal output port E22.

As shown in FIG. 4, the second detection circuit 30 includes a power supply port V3, a ground port G3, signal output ports E31 and E32, a first resistor section R31, a second resistor section R32, a third resistor section R33, and a fourth resistor section R34. The plurality of MR elements of the second detection circuit 30 constitute the first to fourth resistor sections R31, R32, R33, and R34.

The first resistor section R31 is provided between the power supply port V3 and the signal output port E31. The second resistor section R32 is provided between the signal output port E31 and the ground port G3. The third resistor section R33 is provided between the signal output port E32 and the ground port G3. The fourth resistor section R34 is provided between the power supply port V3 and the signal output port E32.

A voltage or current of a predetermined magnitude is applied to each of the power supply ports V2 and V3. Each of the ground ports G2 and G3 is connected to the ground.

The plurality of MR elements of the first detection circuit 20 will be referred to as a plurality of first MR elements 50B. The plurality of MR elements of the second detection circuit 30 will be referred to as a plurality of second MR elements 50C. Since the first and second detection circuits 20 and 30 are the components of the magnetic sensor 1, it can be said that the magnetic sensor 1 includes the plurality of first MR elements 50B and the plurality of second MR elements 50C. Any given MR element will be denoted by the reference numeral 50.

Figure 7:
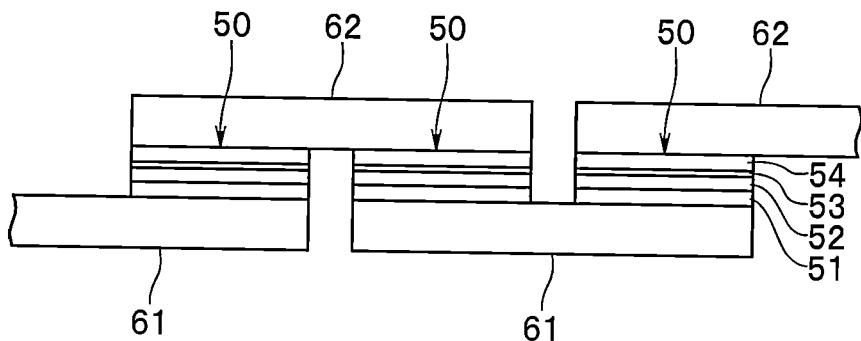
FIG. 7 is a side view showing a magnetoresistive element of the first example embodiment of the technology.

FIG. 7 is a side view showing an MR element 50. The MR element 50 is a spin-valve MR element. The MR element 50 includes a magnetization pinned layer 52 having a magnetization whose direction is fixed, a free layer 54 having a magnetization whose direction is variable depending on the direction of a target magnetic field, and a gap layer 53 located between the magnetization pinned layer 52 and the free layer 54. The MR element 50 may be a tunneling magnetoresistive (TMR) element or a giant magnetoresistive (GMR) element. In the TMR element, the gap layer 53 is a tunnel barrier layer. In the GMR element, the gap layer 53 is a nonmagnetic conductive layer. The resistance of the MR element 50 changes with the angle that the magnetization direction of the free layer 54 forms with respect to the magnetization direction of the magnetization pinned layer 52. The resistance of the MR element 50 is at its minimum value when the foregoing angle is 0°, and at its maximum value when the foregoing angle is 180°. In each MR element 50, the free layer 54 has a shape anisotropy that sets the direction of the magnetization easy axis to be orthogonal to the magnetization direction of the magnetization pinned layer 52. As a method for setting the magnetization easy axis in a predetermined direction in the free layer 54, a magnet configured to apply a bias magnetic field to the free layer 54 can be used.

The MR element 50 further includes an antiferromagnetic layer 51. The antiferromagnetic layer 51, the magnetization pinned layer 52, the gap layer 53, and the free layer 54 are stacked in this order. The antiferromagnetic layer 51 is formed of an antiferromagnetic material, and is in exchange coupling with the magnetization pinned layer 52 to thereby pin the magnetization direction of the magnetization pinned layer 52. The magnetization pinned layer 52 may be a so-called self-pinned layer (Synthetic Ferri Pinned layer, SFP layer). The self-pinned layer has a stacked ferri structure in which a ferromagnetic layer, a nonmagnetic intermediate layer, and a ferromagnetic layer are stacked, and the two ferromagnetic layers are antiferromagnetically coupled. In a case where the magnetization pinned layer 52 is the self-pinned layer, the antiferromagnetic layer 51 may be omitted.

It should be appreciated that the layers 51 to 54 of each MR element 50 may be stacked in the reverse order to that shown in FIG. 7.

In FIGS. 3 and 4, solid arrows represent the magnetization directions of the magnetization pinned layers 52 of the MR elements 50. Hollow arrows represent the magnetization directions of the free layers 54 of the MR elements 50 in a case where no target magnetic field is applied to the MR elements 50.

In the example shown in FIG. 3, the magnetization directions of the magnetization pinned layers 52 in each of the first and third resistor sections R21 and R23 are the W1 direction. The magnetization directions of the magnetization pinned layers 52 in each of the second and fourth resistor sections R22 and R24 are the −W1 direction. The free layer 54 in each of the plurality of first MR elements 50B has a shape anisotropy that sets the direction of the magnetization easy axis to a direction parallel to the U direction. The magnetization directions of the free layers 54 in each of the first and second resistor sections R21 and R22 in a case where no target magnetic field is applied to the first MR elements 50B are the U direction. The magnetization directions of the free layers 54 in each of the third and fourth resistor sections R23 and R24 in the foregoing case are the −U direction.

In the example shown in FIG. 4, the magnetization directions of the magnetization pinned layers 52 in each of the first and third resistor sections R31 and R33 are the W2 direction. The magnetization directions of the magnetization pinned layers 52 in each of the second and fourth resistor sections R32 and R34 are the −W2 direction. The free layer 54 in each of the plurality of second MR elements 50C has a shape anisotropy that sets the direction of the magnetization easy axis to a direction parallel to the U direction. The magnetization directions of the free layers 54 in each of the first and second resistor sections R31 and R32 in a case where no target magnetic field is applied to the second MR elements 50C are the U direction. The magnetization directions of the free layers 54 in each of the third and fourth resistor sections R33 and R34 in the foregoing case are the −U direction.

The magnetic sensor 1 includes a magnetic field generator configured to apply a magnetic field in a predetermined direction to the free layer 54 of each of the plurality of first MR elements 50B, and the plurality of second MR elements 50C. In the present example embodiment, the magnetic field generator includes a coil 80 that applies a magnetic field in the predetermined direction to the free layer 54 in each of the plurality of first MR elements 50B and the plurality of second MR elements 50C. The coil 80 is formed of a conductive material, such as Cu.

Note that the magnetization directions of the magnetization pinned layers 52 and the directions of the magnetization easy axes of the free layers 54 may slightly deviate from the foregoing directions from the perspective of the accuracy of the manufacturing of the MR elements 50 and the like. The magnetization pinned layers 52 may be magnetized to include magnetization components in the foregoing directions as their main components. In such a case, the magnetization directions of the magnetization pinned layers 52 are the same or substantially the same as the foregoing directions.

Hereinafter, a specific structure of the magnetic sensor 1 will be described in detail with reference to FIGS. 5 and 6. FIG. 6 shows a part of a cross section at a position indicated by the line 6-6 in FIG. 5.

The magnetic sensor 1 includes a substrate 301 with a top surface 301a, insulating layers 302, 303, 304, 305, 307, 308, 309, and 310, a plurality of lower electrodes 61B, a plurality of lower electrodes 61C, a plurality of upper electrodes 62B, a plurality of upper electrodes 62C, a plurality of lower coil elements 81, and a plurality of upper coil elements 82. It is assumed that the top surface 301a of the substrate 301 is parallel to the XY plane. The Z direction is also a direction perpendicular to the top surface 301a of the substrate 301. The coil elements are a part of the coil winding.

The insulating layer 302 is disposed on the substrate 301. The plurality of lower coil elements 81 are disposed on the insulating layer 302. The insulating layer 303 is disposed around the plurality of lower coil elements 81 on the insulating layer 302. The insulating layers 304, and 305 are stacked in this order on the plurality of lower coil elements 81 and the insulating layer 303.

The plurality of lower electrodes 61B and the plurality of lower electrodes 61C are disposed on the insulating layer 305. The insulating layer 307 is disposed around the plurality of lower electrodes 61B and the plurality of lower electrodes 61C on the insulating layer 305. The plurality of first MR elements 50B are disposed on the plurality of lower electrodes 61B. The plurality of second MR elements 50C are disposed on the plurality of lower electrodes 61C. The insulating layer 308 is disposed around the plurality of first MR elements 50B and the plurality of second MR elements 50C on the plurality of lower electrodes 61B, the plurality of lower electrodes 61C, and the insulating layer 307. The plurality of upper electrodes 62B are disposed on the plurality of first MR elements 50B and the insulating layer 308. The plurality of upper electrodes 62C are disposed on the plurality of second MR elements 50C and the insulating layer 308. The insulating layer 309 is disposed around the plurality of upper electrodes 62B and the plurality of upper electrodes 62C on the insulating layer 308.

The insulating layer 310 is disposed on the plurality of upper electrodes 62B, the plurality of upper electrodes 62C, and the insulating layer 309. The plurality of upper coil elements 82 are disposed on the insulating layer 310.

The magnetic sensor 1 further includes a plurality of first insulating films 311 and a second insulating film 312. The plurality of first insulating films 311 and the second insulating film 312 cover the plurality of upper coil elements 82 and the insulating layer 310. The plurality of first insulating films 311 and the second insulating film 312 will be described in detail later.

The magnetic sensor 1 includes a support member supporting the plurality of first MR elements 50B and the plurality of second MR elements 50C. The support member includes at least one inclined surface inclined with respect to the top surface 301a of the substrate 301. In particular, in the example embodiment, the support member includes the insulating layer 305. Note that FIG. 5 shows the insulating layer 305, the plurality of first MR elements 50B, the plurality of second MR elements 50C, and the plurality of upper coil elements 82 among the components of the magnetic sensor 1.

The insulating layer 305 includes a plurality of protruding surfaces 305c each protruding in a direction (the Z direction) away from the top surface 301a of the substrate 301. Each of the plurality of protruding surfaces 305c extends in a direction parallel to the U direction. The overall shape of each of the protruding surfaces 305c is a semi-cylindrical curved surface formed by moving the curved shape (arch shape) of the protruding surface 305c shown in FIG. 6 along the direction parallel to the U direction. The plurality of protruding surfaces 305c are arranged at predetermined intervals along a direction parallel to the V direction.

Each of the plurality of protruding surfaces 305c includes an upper end portion farthest from the top surface 301a of the substrate 301. In the example embodiment, each of the upper end portions of the plurality of protruding surfaces 305c extends in the direction parallel to the U direction. Herein, focus is placed on a given protruding surface 305c of the plurality of protruding surfaces 305c. The protruding surface 305c includes a first inclined surface 305a and a second inclined surface 305b. The first inclined surface 305a refers to the part of the protruding surface 305c on the side of the V direction of the upper end portion of the protruding surface 305c. The second inclined surface 305b refers to the part of the protruding surface 305c on the side of the −V direction of the upper end portion of the protruding surface 305c. In FIG. 5, a boundary between the first inclined surface 305a and the second inclined surface 305b is indicated by a dotted line.

The upper end portion of the protruding surface 305c may be the boundary between the first inclined surface 305a and the second inclined surface 305b. In such a case, the dotted line shown in FIG. 5 indicates the upper end portion of the protruding surface 305c.

The top surface 301a of the substrate 301 is parallel to the XY plane. Each of the first inclined surface 305a and the second inclined surface 305b is inclined with respect to the top surface 301a of the substrate 301, that is, the XY plane. In a cross section perpendicular to the top surface 301a of the substrate 301, a distance between the first inclined surface 305a and the second inclined surface 305b becomes smaller in a direction away from the top surface 301a of the substrate 301.

In the example embodiment, since two or more protruding surface 305c are present, the number of each of the first inclined surfaces 305a and the second inclined surfaces 305b is also two or more. The insulating layer 305 includes the plurality of first inclined surfaces 305a and the plurality of second inclined surfaces 305b.

The insulating layer 305 further includes a flat surface 305d present around the plurality of protruding surfaces 305c. The flat surface 305d is a surface parallel to the top surface 301a of the substrate 301. Each of the plurality of protruding surfaces 305c protrudes in the Z direction from the flat surface 305d. In the example embodiment, the plurality of protruding surfaces 305c are disposed at predetermined intervals. Thus, the flat surface 305d is present between the two protruding surfaces 305c adjoining in the V direction.

The insulating layer 305 includes a plurality of protruding portions each protruding in the Z direction, and a flat portion present around the plurality of protruding portions. Each of the plurality of protruding portions extends in the direction parallel to the U direction and includes the protruding surface 305c. The plurality of protruding portions are arranged at predetermined intervals in the direction parallel to the V direction. The thickness (the dimension in the Z direction) of the flat portion is substantially constant. The insulating layer 304 has a substantially constant thickness (i.e., a dimension in the Z direction), and is formed along the bottom surface of the insulating layer 305.

The plurality of lower electrodes 61B are disposed on the plurality of first inclined surfaces 305a. The plurality of lower electrodes 61C are disposed on the plurality of second inclined surfaces 305b. As described above, since each of the first inclined surfaces 305a and the second inclined surfaces 305b is inclined with respect to the top surface 301a of the substrate 301, that is, the XY plane, each of the top surfaces of the plurality of lower electrodes 61B and each of the top surfaces of the plurality of lower electrodes 61C are also inclined with respect to the XY plane. Thus, it can be said that the plurality of first MR elements 50B and the plurality of second MR elements 50C are disposed on the inclined surfaces inclined with respect to the XY plane. The insulating layer 305 is a member for supporting each of the plurality of first MR elements 50B and the plurality of second MR elements 50C so as to allow such MR elements to be inclined with respect to the XY plane.

Note that in the example embodiment, the first inclined surfaces 305a are curved surfaces. Therefore, the first MR elements 50B are curved along the curved surfaces (the first inclined surfaces 305a). For the sake of convenience, in the present example embodiment, the magnetization directions of the magnetization pinned layers 52 of the first MR elements 50B are defined as straight directions as described above. The W1 direction and the −W1 direction that are the magnetization directions of the magnetization pinned layers 52 of the first MR elements 50B are also directions in which the tangents to the first inclined surfaces 305a at the vicinity of the first MR elements 50B extend.

Similarly, in the example embodiment, the second inclined surfaces 305b are curved surfaces. Therefore, the second MR elements 50C are curved along the curved surfaces (the second inclined surfaces 305b). For the sake of convenience, in the present example embodiment, the magnetization directions of the magnetization pinned layers 52 of the second MR elements 50C are defined as straight directions as described above. The W2 direction and the −W2 direction that are the magnetization directions of the magnetization pinned layers 52 of the second MR elements 50C are also directions in which the tangents to the second inclined surfaces 305b at the vicinity of the second MR elements 50C extend.

As shown in FIG. 5, the plurality of first MR elements 50B are disposed so that two or more MR elements 50B are arranged both in the U direction and in the V direction. The plurality of first MR elements 50B are aligned in a row on one first inclined surface 305a. Similarly, the plurality of second MR elements 50C are disposed so that two or more MR elements 50C are arranged both in the U direction and in the V direction. The plurality of second MR elements 50C are aligned in a row on one second inclined surface 305b. In the example embodiment, the row of the plurality of first MR elements 50B and the row of the plurality of second MR elements 50C are alternately arranged in the direction parallel to the V direction.

Note that one first MR element 50B and one second MR element 50C adjoining each other may or may not deviate in the direction parallel to the U direction when seen in the Z direction. Two first MR elements 50B adjoining each other across one second MR element 50C may or may not deviate in the direction parallel to the U direction when seen in the Z direction. Two second MR elements 50C adjoining each other across one first MR element 50B may or may not deviate in the direction parallel to the U direction when seen in the Z direction.

The plurality of first MR elements 50B are connected in series by the plurality of lower electrodes 61B and the plurality of upper electrodes 62B. Herein, a method for connecting the plurality of first MR elements 50B will be described in detail with reference to FIG. 7. In FIG. 7, the reference sign 61 denotes a lower electrode corresponding to a given MR element 50, and the reference numeral 62 denotes an upper electrode corresponding to the given MR element 50. As shown in FIG. 7, each lower electrode 61 has a long slender shape. Two lower electrodes 61 adjoining in the longitudinal direction of the lower electrodes 61 have a gap therebetween. MR elements 50 are disposed near both longitudinal ends on the top surface of each lower electrode 61. Each upper electrode 62 has a long slender shape, and electrically connects two adjoining MR elements 50 that are disposed on two lower electrodes 61 adjoining in the longitudinal direction of the lower electrodes 61.

Although not shown, one MR element 50 located at the end of a row of a plurality of aligned MR elements 50 is connected to another MR element 50 located at the end of another row of a plurality of MR elements 50 adjoining in a direction intersecting with the longitudinal direction of the lower electrodes 61. Such two MR elements 50 are connected to each other by a not-shown electrode. The not-shown electrode may be an electrode that connects the bottom surfaces or the top surfaces of the two MR elements 50.

In a case where the MR elements 50 shown in FIG. 7 are the first MR elements 50B, the lower electrodes 61 shown in FIG. 7 correspond to the lower electrodes 61B, and the upper electrodes 62 shown in FIG. 7 correspond to the upper electrodes 62B. In such a case, the longitudinal direction of the lower electrodes 61 is parallel to the U direction.

Similarly, the plurality of second MR elements 50C are connected in series by the plurality of lower electrodes 61C and the plurality of upper electrodes 62C. The foregoing description of the method for connecting the plurality of first MR elements 50B holds true also for the method for connecting the plurality of second MR elements 50C. In a case where the MR elements 50 shown in FIG. 7 are the second MR elements 50C, the lower electrodes 61 shown in FIG. 7 correspond to the lower electrodes 61C, and the upper electrodes 62 shown in FIG. 7 correspond to the upper electrodes 62C. In such a case, the longitudinal direction of the lower electrodes 61 is parallel to the U direction.

Each of the plurality of upper coil elements 82 extends in a direction parallel to the Y direction. The plurality of upper coil elements 82 are arranged in the X direction. In particular, in the present example embodiment, when seen in the Z direction, each of the plurality of first MR elements 50B and the plurality of second MR elements 50C overlaps two upper coil elements 82.

Each of the plurality of lower coil elements 81 extends in a direction parallel to the Y direction. The plurality of lower coil elements 81 are arranged in the X direction. The shape and arrangement of the plurality of lower coil elements 81 may be the same as or different from those of the plurality of upper coil elements 82. In the example shown in FIGS. 5 and 6, the dimension in the X direction of each of the plurality of lower coil elements 81 is smaller than the dimension in the X direction of each of the plurality of upper coil elements 82. The distance between two lower coil elements 81 adjoining in the X direction is smaller than the distance between two upper coil elements 82 adjoining in the X direction.

In the example shown in FIGS. 5 and 6, the plurality of lower coil elements 81 and the plurality of upper coil elements 82 are electrically connected so as to constitute the coil 80 that applies a magnetic field in a direction parallel to the X direction to the free layer 54 in each of the plurality of first MR elements 50B and the plurality of second MR elements 50C. Alternatively, the coil 80 may be configured to be able to, for example, apply a magnetic field in the X direction to the free layers 54 in the first and second resistor sections R21 and R22 of the first detection circuit 20 and the first and second resistor sections R31 and R32 of the second detection circuit 30, and apply a magnetic field in the −X direction to the free layers 54 in the third and fourth resistor sections R23 and R24 of the first detection circuit 20 and the third and fourth resistor sections R33 and R34 of the second detection circuit 30. The coil 80 may be controlled by the processor 40.

Next, the first and second detection signals will be described. First, the first detection signal will be described with reference to FIG. 3. As the strength of the component of the target magnetic field in the direction parallel to the W1 direction changes, the resistance of each of the resistor sections R21 to R24 of the first detection circuit 20 changes either so that the resistances of the resistor sections R21 and R23 increase and the resistances of the resistor sections R22 and R24 decrease or so that the resistances of the resistor sections R21 and R23 decrease and the resistances of the resistor sections R22 and R24 increase. Thereby the electric potential of each of the signal output ports E21 and E22 changes. The first detection circuit 20 generates a signal corresponding to the electric potential of the signal output port E21 as a first detection signal S21, and generates a signal corresponding to the electric potential of the signal output port E22 as a first detection signal S22.

Next, the second detection signal will be described with reference to FIG. 4. As the strength of the component of the target magnetic field in the direction parallel to the W2 direction changes, the resistance of each of the resistor sections R31 to R34 of the second detection circuit 30 changes either so that the resistances of the resistor sections R31 and R33 increase and the resistances of the resistor sections R32 and R34 decrease or so that the resistances of the resistor sections R31 and R33 decrease and the resistances of the resistor sections R32 and R34 increase. Thereby the electric potential of each of the signal output ports E31 and E32 changes. The second detection circuit 30 generates a signal corresponding to the electric potential of the signal output port E31 as a second detection signal S31, and generates a signal corresponding to the electric potential of the signal output port E32 as a second detection signal S32.

Next, the operation of the processor 40 will be described. The processor 40 is configured to generate the first detection value and the second detection value based on the first detection signals S21 and S22 and the second detection signals S31 and S32. The first detection value is a detection value corresponding to the component of the target magnetic field in the direction parallel to the V direction. The second detection value is a detection value corresponding to the component of the target magnetic field in the direction parallel to the Z direction. The first detection value is represented by a symbol Sv, and the second detection value is represented by a symbol Sz.

The processor 40 generates the first and second detection values Sv and Sz as follows, for example. First, the processor 40 generates a value S1 by an arithmetic including obtainment of the difference S21-S22 between the first detection signal S21 and the first detection signal S22, and generates a value S2 by an arithmetic including obtainment of the difference S31-S32 between the second detection signal S31 and the second detection signal S32. Next, the processor 40 calculates values S3 and S4 using the following expressions (1) and (2).

$$S3 = (S2 + S1)/(2\cos\alpha) \qquad (1)$$

$$S4 = (S2 - S1)/(2\sin\alpha) \qquad (2)$$

The first detection value Sv may be the value S3 itself, or may be a result of a predetermined correction, such as a gain adjustment or an offset adjustment, made to the value S3. In the same manner, the second detection value Sz may be the value S4 itself, or may be a result of a predetermined correction, such as a gain adjustment or an offset adjustment, made to the value S4.

Next, features of the structure of the magnetic sensor 1 according to the example embodiment will be described. The magnetic sensor 1 according to the present example embodiment includes the substrate 301 including a reference plane, at least one magnetic detection element and the insulating layer 310 provided on the substrate 301, at least one metal layer and the plurality of first insulating films 311 disposed on the insulating layer 310, and the second insulating film 312 covering the at least one metal layer and the plurality of first insulating films 311. In the present example embodiment, the top surface 301a of the substrate 301 (see FIG. 6) is assumed as the reference plane. The Z direction is one direction perpendicular to the reference plane (the top surface 301a of the substrate 301).

In the present example embodiment, the at least one magnetic detection element includes the plurality of first MR elements 50B and the plurality of second MR elements 50C. In the present example embodiment, the at least one metal layer includes the plurality of upper coil elements 82. The plurality of upper coil elements 82 are disposed at predetermined intervals. Hereinafter, structural features of the magnetic sensor 1 will be described in detail focusing on one upper coil element 82. Note that in the following description, the upper coil element 82 will be simply referred to as the coil element 82.

Figure 8:
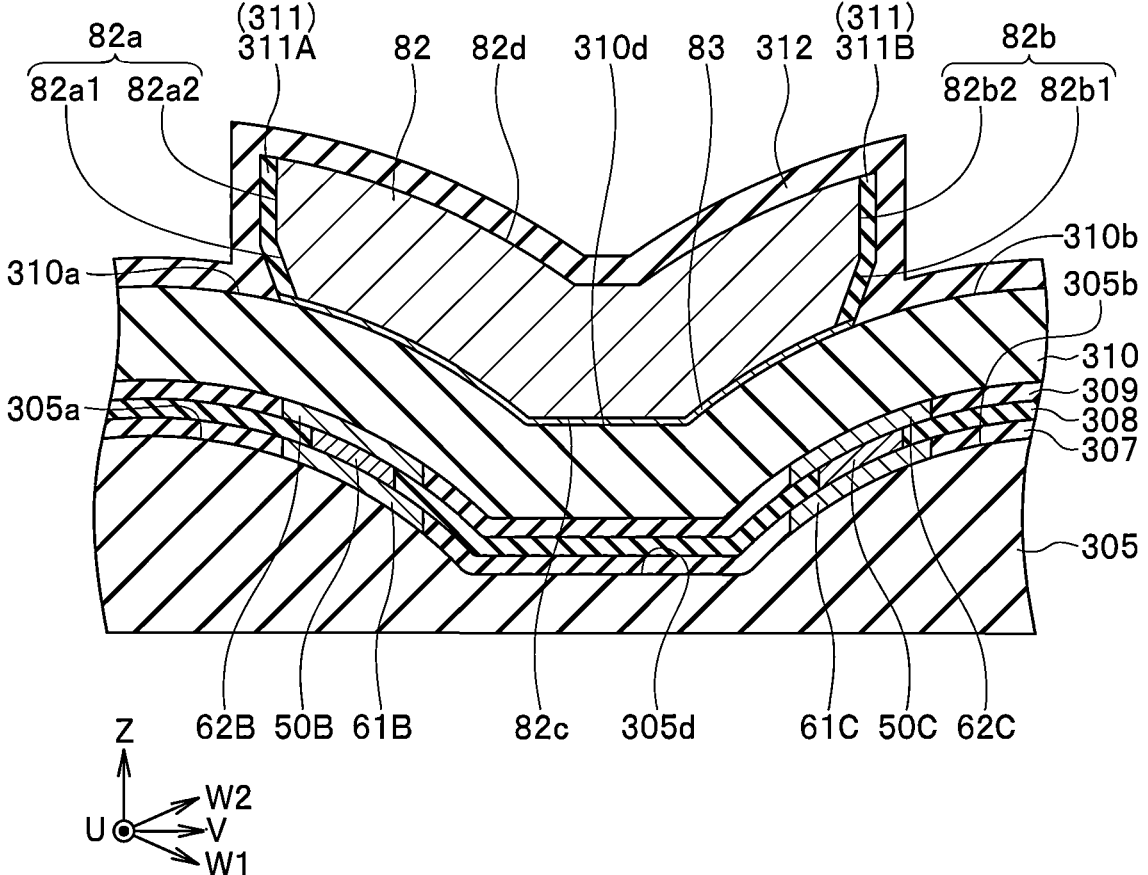
FIG. 8 is a sectional view showing a main part of the magnetic sensor according to the first example embodiment of the technology.
Figure 9:
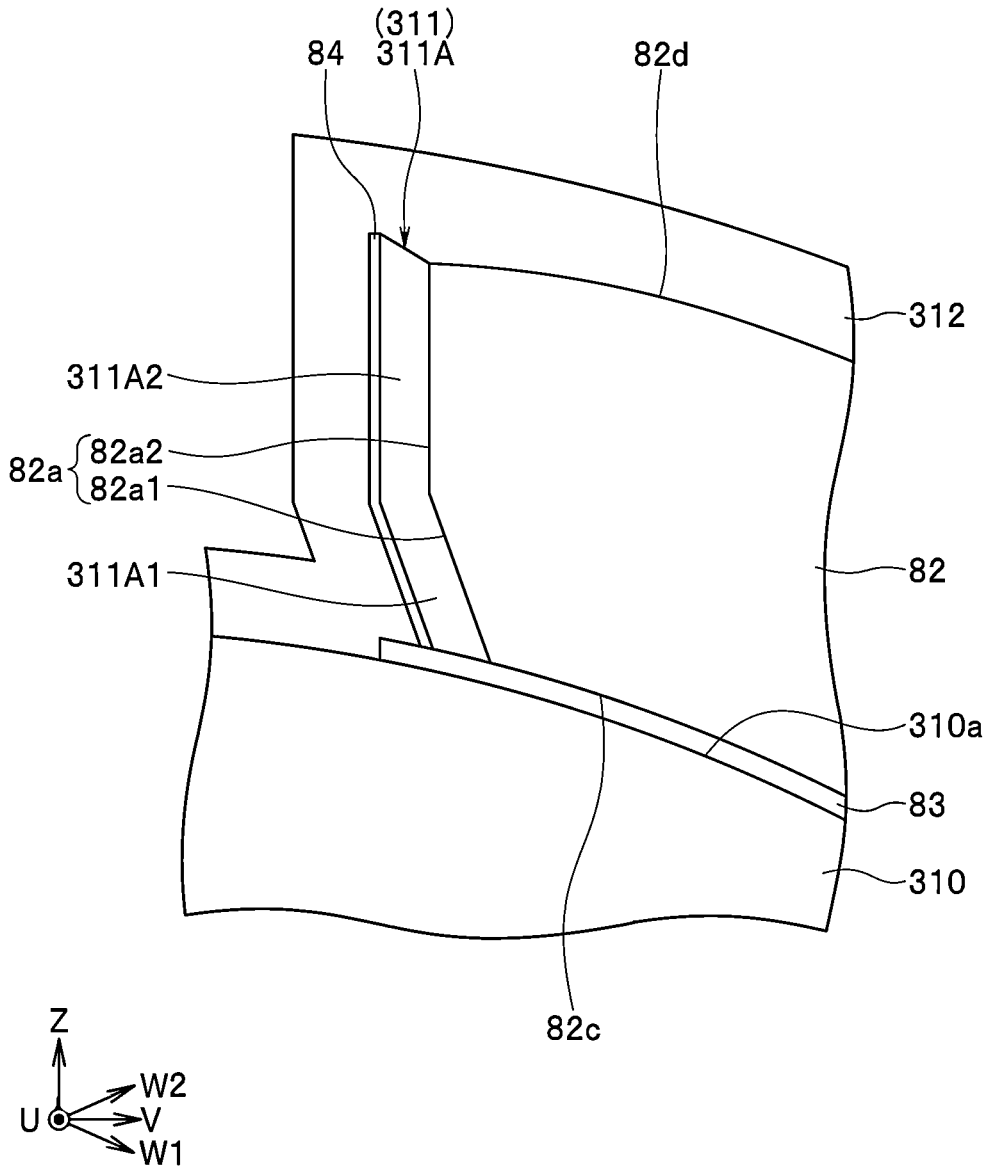
FIG. 9 is a sectional view showing a portion near a first side surface of a coil element shown in FIG. 8.
Figure 10:
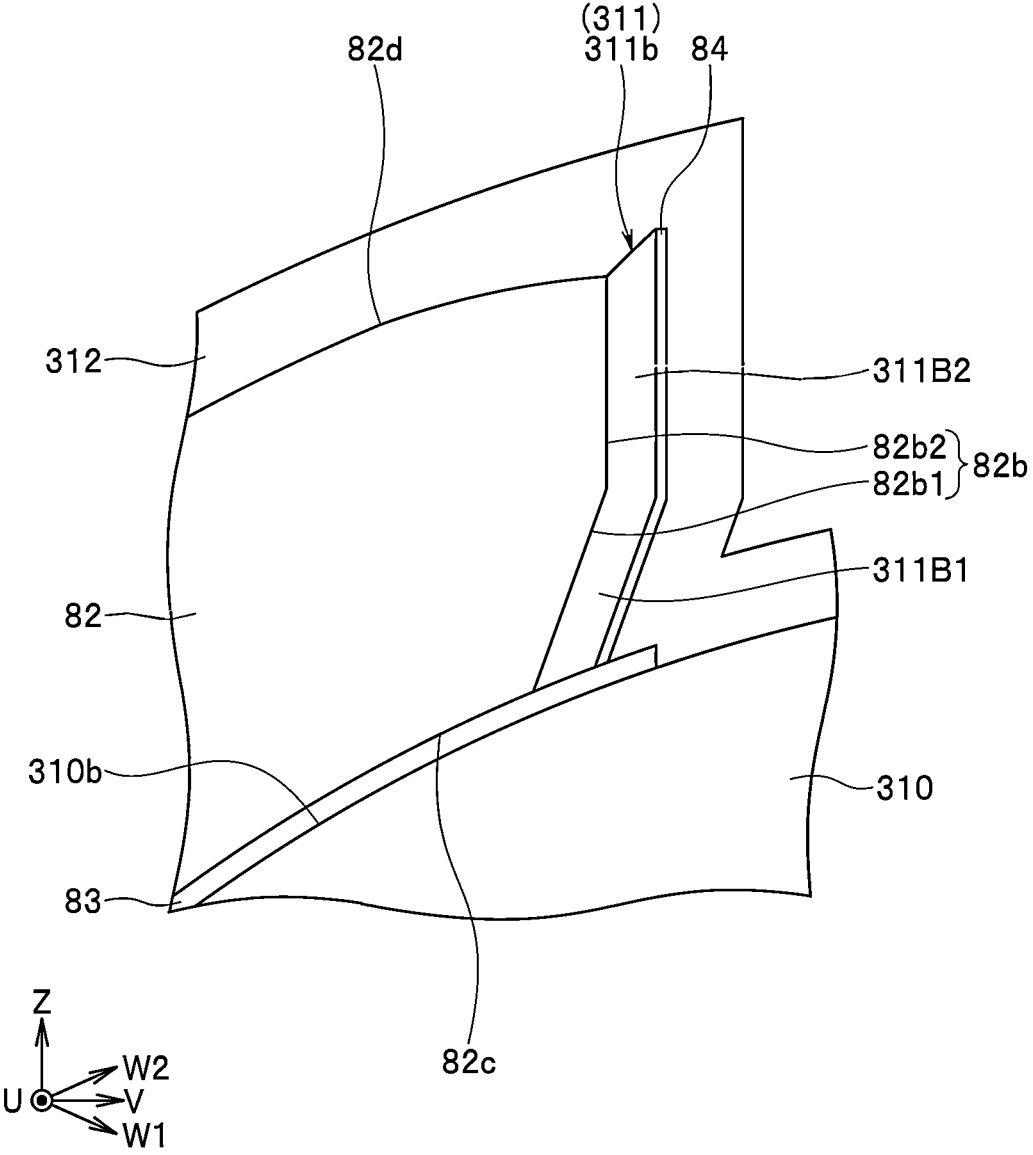
FIG. 10 is a sectional view showing a portion near a second side surface of the coil element shown in FIG. 8.

FIG. 8 is a sectional view showing a main part of the magnetic sensor 1. FIG. 8 shows one first MR element 50B, one second MR element 50C, and one coil element 82. FIG. 9 is a sectional view showing a portion near a first side surface of the coil element 82 shown in FIG. 8. FIG. 10 is a sectional view showing a portion near a second side surface of the coil element 82 shown in FIG. 8.

The insulating layer 310 covers the plurality of first MR elements 50B, the plurality of second MR elements 50C, the plurality of lower electrodes 61B, the plurality of lower electrodes 61C, the plurality of upper electrodes 62B, the plurality of upper electrodes 62C, and the insulating layers 305 and 307 to 309. The insulating layer 310 may have an almost constant thickness.

The insulating layer 310 includes at least one inclined surface inclined with respect to the reference plane, that is, the top surface 301a of the substrate 301 (see FIG. 6). In particular, in the present example embodiment, a top surface of the insulating layer 310 has a shape corresponding to a top surface of the insulating layer 305. In other words, the insulating layer 310 includes a plurality of first inclined surfaces 310a and a plurality of second inclined surfaces 310b as the at least one inclined surface. Each of the plurality of first inclined surfaces 310a is located above each of the plurality of first inclined surfaces 305a of the insulating layer 305. Each of the plurality of second inclined surfaces 310b is located above each of the plurality of second inclined surfaces 305b of the insulating layer 305. The shapes and arrangement of the plurality of first inclined surfaces 310a and the plurality of second inclined surfaces 310b are similar to the shapes and arrangement of the plurality of first inclined surfaces 305a and the plurality of second inclined surfaces 305b. The description of the plurality of first inclined surfaces 305a and the plurality of second inclined surfaces 305b holds true also for the plurality of first inclined surfaces 310a and the plurality of second inclined surfaces 310b.

The insulating layer 310 further includes a flat surface 310d present around each of the plurality of first inclined surfaces 310a and the plurality of second inclined surfaces 310b. The flat surface 310d is a plane parallel to or almost parallel to the top surface 301a of the substrate 301.

At least a part of the coil element 82 has a shape that is long in a predetermined direction. In particular, in the present example embodiment, the coil element 82 has a shape that is long in the direction parallel to the Y direction (see FIG. 5). Each of the plurality of first inclined surfaces 310a and the plurality of second inclined surfaces 310b has a shape that is long in the direction parallel to the U direction as with the plurality of protruding surfaces 305c of the insulating layer 305. Therefore, the longitudinal direction of the coil element 82 crosses the longitudinal direction of each of the plurality of first inclined surfaces 310a and the plurality of second inclined surfaces 310b. The coil element 82 passes through above the plurality of first inclined surfaces 310a and the plurality of second inclined surfaces 310b.

The longitudinal direction of the coil element 82 also crosses the longitudinal direction of each of the plurality of protruding surfaces 305c. The coil element 82 passes through above the plurality of protruding surfaces 305c. The dimension of the coil element 82 in the short-side direction of the coil element 82, that is, the direction parallel to the X direction may be larger or smaller than the dimension of the protruding surface 305c in the short-side direction of the protruding surface 305c, that is, the direction parallel to the V direction. Alternatively, the dimension of the coil element 82 in the direction parallel to the X direction may be equal to or almost equal to the dimension of the protruding surface 305c in the direction parallel to the V direction. The thickness (i.e., the dimension in the Z direction) of the coil element 82 may be in the range of 2 to 3 μm, for example.

The coil element 82 includes two side surfaces located at both ends in the short-side direction of the coil element 82, that is, the direction parallel to the X direction. Hereinafter, of the two side surfaces, a side surface on the side of the −X direction will be referred to as a first side surface 82a, and a side surface on the side of the X direction will be referred to as a second side surface 82b. Note that FIG. 8 shows a cross section in which the first side surface 82a is located above the first inclined surface 310a, and the second side surface 82b is located above the second inclined surface 310b. If the cross section shown in FIG. 8 is moved along the direction parallel to the Y direction, the first side surface 82a is also present above the second inclined surface 310b and above the flat surface 310d, and the second side surface 82b is also present above the first inclined surface 310a and above the flat surface 310d.

The coil element 82 further includes a bottom surface 82c and a top surface 82d. The bottom surface 82c faces the plurality of first inclined surfaces 310a and the plurality of second inclined surfaces 310b. The top surface 82d is located forward in the direction away from the reference plane, that is, the top surface 301a of the substrate 301 (the Z direction).

As shown in FIGS. 8 and 9, the first side surface 82a includes a first portion 82a1 and a second portion 82a2 disposed at a position farther from the reference plane, that is, the top surface 301a of the substrate 301 than a position where the first portion 82a1 is disposed. The first portion 82a1 is inclined so as to intersect with the first and second inclined surfaces 310a and 310b. In the cross sections shown in FIGS. 8 and 9, the first portion 82*a*1 is inclined so as to intersect with the first inclined surface 310*a*. The first portion 82*a*1 is also inclined so as to be closer to the second side surface 82*b* at positions closer to the top surface 301*a* of the substrate 301.

The first portion 82*a*1 may be connected to the bottom surface 82*c*. The second portion 82*a*2 may connect the first portion 82*a*1 and the top surface 82*d*.

As shown in FIGS. 8 and 10, the second side surface 82*b* includes a first portion 82*b*1 and a second portion 82*b*2 disposed at a position farther from the reference plane, that is, the top surface 301*a* of the substrate 301 than a position where the first portion 82*b*1 is disposed. The first portion 82*b*1 is inclined so as to intersect with the first and second inclined surfaces 310*a* and 310*b*. In the cross sections shown in FIGS. 8 and 10, the first portion 82*b*1 is inclined so as to intersect with the second inclined surface 310*b*. The first portion 82*b*1 is also inclined so as to be closer to the first side surface 82*a* at positions closer to the top surface 301*a* of the substrate 301.

The first portion 82*b*1 may be connected to the bottom surface 82*c*. The second portion 82*b*2 may connect the first portion 82*b*1 and the top surface 82*d*.

Note that as shown in FIGS. 8 to 10, each of the first portions 82*a*1 and 82*b*1 is drawn as a straight line for convenience sake. In other words, in FIGS. 8 to 10, each of the first portions 82*a*1 and 82*b*1 is drawn as a plane (a plane inclined with respect to a YZ plane). However, each of the first portions 82*a*1 and 82*b*1 may also be a curved surface. Even if each of the first portions 82*a*1 and 82*b*1 is a curved surface, the first portions 82*a*1 and 82*b*1 are inclined so as to respectively intersect with the first and second inclined surfaces 310*a* and 310*b*.

In FIGS. 8 to 10, each of the second portions 82*a*2 and 82*b*2 is also drawn as a straight line parallel to the Z direction for convenience sake. In other words, in FIGS. 8 to 10, each of the second portions 82*a*2 and 82*b*2 is drawn as a plane (a plane parallel to the YZ plane). However, each of the second portions 82*a*2 and 82*b*2 may also be a curved surface.

Each of the plurality of first insulating films 311 covers the first side surface 82*a* or the second side surface 82*b*. Hereinafter, among the plurality of first insulating films 311, the first insulating film 311 covering the first side surface 82*a* is represented by the reference sign 311A, and the first insulating film 311 covering the second side surface 82*b* is represented by the reference sign 311B. Each of the first insulating films 311A and 311B may have an almost constant thickness.

The first insulating film 311A includes a portion 311A1 covering the first portion 82*a*1 of the first side surface 82*a* and extending in a direction intersecting with the first and second inclined surfaces 310*a* and 310*b*. The portion 311A1 also extends in the longitudinal direction of the coil element 82, that is, the direction parallel to the Y direction. The first insulating film 311A further includes a portion 311A2 covering the second portion 82*a*2 of the first side surface 82*a*.

The first insulating film 311A does not cover the top surface 82*d* of the coil element 82. As shown in FIG. 9, the first insulating film 311A may further include a portion present at a position farther from the top surface 301*a* of the substrate 301 than is a corner portion present at a position where the first side surface 82*a* and the top surface 82*d* intersect. Note that the foregoing corner portion may be a virtual line formed by crossing one curved surface, which is obtained by approximating the overall shape of the top surface 82*d*, and the first side surface 82*a*. Alternatively, the foregoing corner portion may be a virtual line formed by crossing a curved surface obtained by extending one curved surface, which is obtained by approximating the shape of a portion of the top surface 82*d* excluding a portion near the first side surface 82*a*, to the first side surface 82*a* and the first side surface 82*a*.

The first insulating film 311B includes a portion 311B1 covering the first portion 82*b*1 of the second side surface 82*b* and extending in a direction intersecting with the first and second inclined surfaces 310*a* and 310*b*. The portion 311B1 also extends in the longitudinal direction of the coil element 82, that is, the direction parallel to the Y direction. The first insulating film 311B further includes a portion 311B2 covering the second portion 82*b*2 of the second side surface 82*b*.

The first insulating film 311B does not cover the top surface 82*d* of the coil element 82. As shown in FIG. 10, the first insulating film 311B may further include a portion present at a position farther from the top surface 301*a* of the substrate 301 than is a corner portion present at a position where the second side surface 82*b* and the top surface 82*d* intersect. Note that the foregoing corner portion may be a virtual line formed by crossing one curved surface, which is obtained by approximating the overall shape of the top surface 82*d*, and the second side surface 82*b*. Alternatively, the foregoing corner portion may be a virtual line formed by crossing a curved surface obtained by extending one curved surface, which is obtained by approximating the shape of a portion of the top surface 82*d* excluding a portion near the second side surface 82*b*, to the second side surface 82*b* and the second side surface 82*b*.

As shown in FIGS. 8 to 10, the magnetic sensor 1 includes a nonmagnetic metal film 83 provided between the coil element 82 and the first and second inclined surfaces 310*a* and 310*b* as well as the flat surface 310*d*. The coil element 82 may be formed by plating. In such a case, the nonmagnetic metal film 83 may be used as a seed and an electrode in a step of forming the coil element 82.

The dimension of the nonmagnetic metal film 83 in the short-side direction of the coil element 82, that is, the direction parallel to the X direction is larger than the minimum dimension of the coil element 82 in the direction parallel to the X direction. In particular, in the present example embodiment, the nonmagnetic metal film 83 includes a portion extending in the −X direction from the first side surface 82*a* of the coil element 82 (see FIG. 9) and a portion extending in the X direction from the second side surface 82*b* of the coil element 82 (see FIG. 10).

The dimension of the nonmagnetic metal film 83 in the direction parallel to the X direction may be larger or smaller than the maximum dimension of the coil element 82 in the direction parallel to the X direction. Alternatively, the dimension of the nonmagnetic metal film 83 in the direction parallel to the X direction may be equal to or almost equal to the maximum dimension of the coil element 82 in the direction parallel to the X direction.

Note that in the present example embodiment, since there are a plurality of coil elements 82, there are also a plurality of nonmagnetic metal films 83.

As shown in FIGS. 9 and 10, the magnetic sensor 1 further includes a plurality of nonmagnetic films 84 attached to respective surfaces of the plurality of first insulating films 311. The plurality of nonmagnetic films 84 may be reattached films formed as the particles of the nonmagnetic metal films 83, which have been scattered through etching, are attached to the surfaces of the plurality of first insulating films 311 during the process of manufacturing the magnetic sensor 1.

As shown in FIGS. 8 to 10, the second insulating film 312 covers the plurality of coil elements 82, the plurality of nonmagnetic metal films 83, the plurality of nonmagnetic films 84, the insulating layer 310, and the plurality of first insulating films 311.

The description has been made heretofore of the structural features of the magnetic sensor 1 focusing on one coil element 82. Herein, focus is placed on the two coil elements 82 adjoining in the direction parallel to the X direction, the first side surface 82a of one of the two coil elements 82, and the second side surface 82b of the other of the two coil elements 82 that faces the first side surface 82a of the one of the two coil elements 82. A gap between the first portion 82a1 of the foregoing first side surface 82a and the first portion 82b1 of the foregoing second side surface 82b becomes larger at positions closer to the top surface 301a of the substrate 301.

Each of the plurality of first insulating films 311 and the second insulating film 312 is formed of an insulating material. For example, $Al_2O_3$ can be used as the insulating material for forming each of the plurality of first insulating films 311. For example, $Si_3N_4$ can be used as the insulating material for forming the second insulating film 312.

The nonmagnetic metal films 83 may be formed of Ti or Cu, or a stacked film of Ti and Cu, for example.

Next, a method for manufacturing the magnetic sensor 1 according to the present example embodiment will be described. The method for manufacturing the magnetic sensor 1 includes a step of forming, on a wafer including portions to become substrates 301 of a plurality of magnetic sensors 1, components other than the substrates 301 of the plurality of magnetic sensors 1, and thus fabricating a fundamental structure in which a plurality of pre-sensor portions to become the magnetic sensors 1 later are arranged in rows, and a step of dicing the fundamental structure to isolate the plurality of pre-sensor portions from one another. The plurality of magnetic sensors 1 are manufactured in this way.

Hereinafter, the method for manufacturing the magnetic sensor 1 according to the present example embodiment will be descried in further detail focusing on one magnetic sensor 1. First, steps up to the step of forming the insulating layer 310 will be described with reference to FIGS. 5 and 6. In the method for manufacturing the magnetic sensor 1, first, the insulating layer 302 is formed on the substrate 301. Next, the plurality of lower coil elements 81 and the insulating layer 303 are formed on the insulating layer 302. Next, the insulating layer 304 is formed on the plurality of lower coil elements 81 and the insulating layer 303.

Next, the insulating layer 305 is formed on the insulating layer 304. The plurality of protruding surfaces 305c of the insulating layer 305 are formed by, for example, forming a plurality of etching masks on the insulating layer 305 and then etching the insulating layer 305 and the plurality of etching masks so as to remove the plurality of etching masks. The plurality of etching masks have shapes corresponding to the plurality of protruding surfaces 305c. A portion of the insulating layer 305 not covered with the plurality of etching masks becomes the flat surface 305d.

Next, the plurality of lower electrodes 61B, the plurality of lower electrodes 61C, the plurality of first MR elements 50B, the plurality of second MR elements 50C, the plurality of upper electrodes 62B, the plurality of upper electrodes 62C, and the insulating layers 307 to 310 are formed on the insulating layer 305.

Next, steps after the insulating layer 310 is formed will be described with reference to FIGS. 11 to 14. FIGS. 11 to 14 each show a stack during the process of manufacturing the magnetic sensor 1. Note that in FIGS. 11 to 14, portions closer to the substrate 301 than is the insulating layer 305 are omitted.

Figure 11:
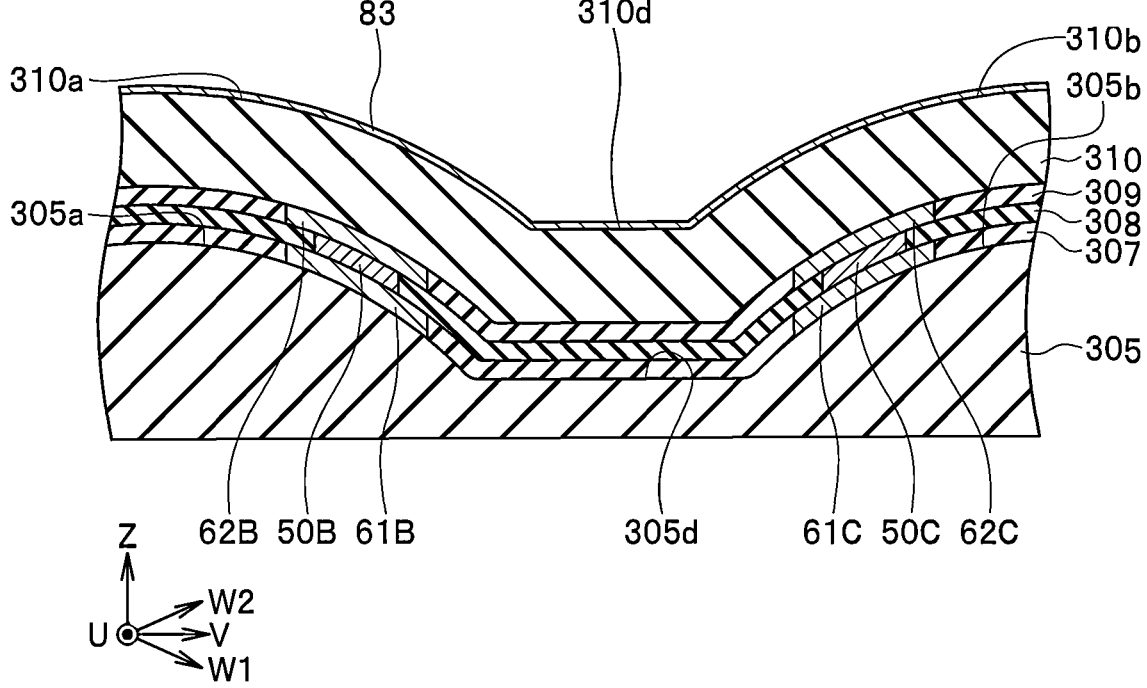
FIG. 11 is a cross-sectional view showing a step of a manufacturing method for the magnetic sensor according to the first example embodiment of the technology.

FIG. 11 shows a step after the insulating layer 310 is formed. In this step, first, the nonmagnetic metal film 83 is formed on the insulating layer 310. Next, a not-shown photoresist layer to be used for forming the plurality of coil elements 82 is formed on the nonmagnetic metal film 83.

Figure 12:
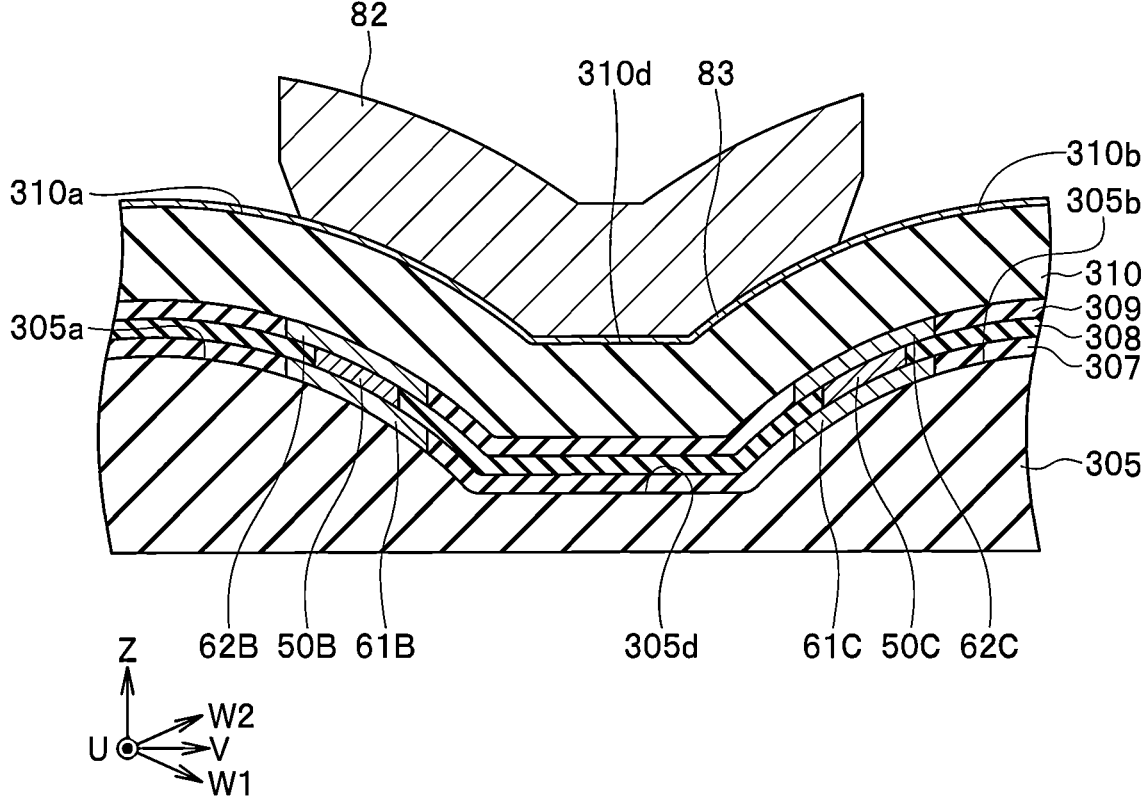
FIG. 12 is a cross-sectional view showing a step that follows the step shown in FIG. 11.

FIG. 12 shows a next step. In this step, first, the plurality of coil elements 82 are formed on the nonmagnetic metal film 83. The plurality of coil elements 82 are formed by plating, for example. Next, the not-shown photoresist layer is removed.

Figure 13:
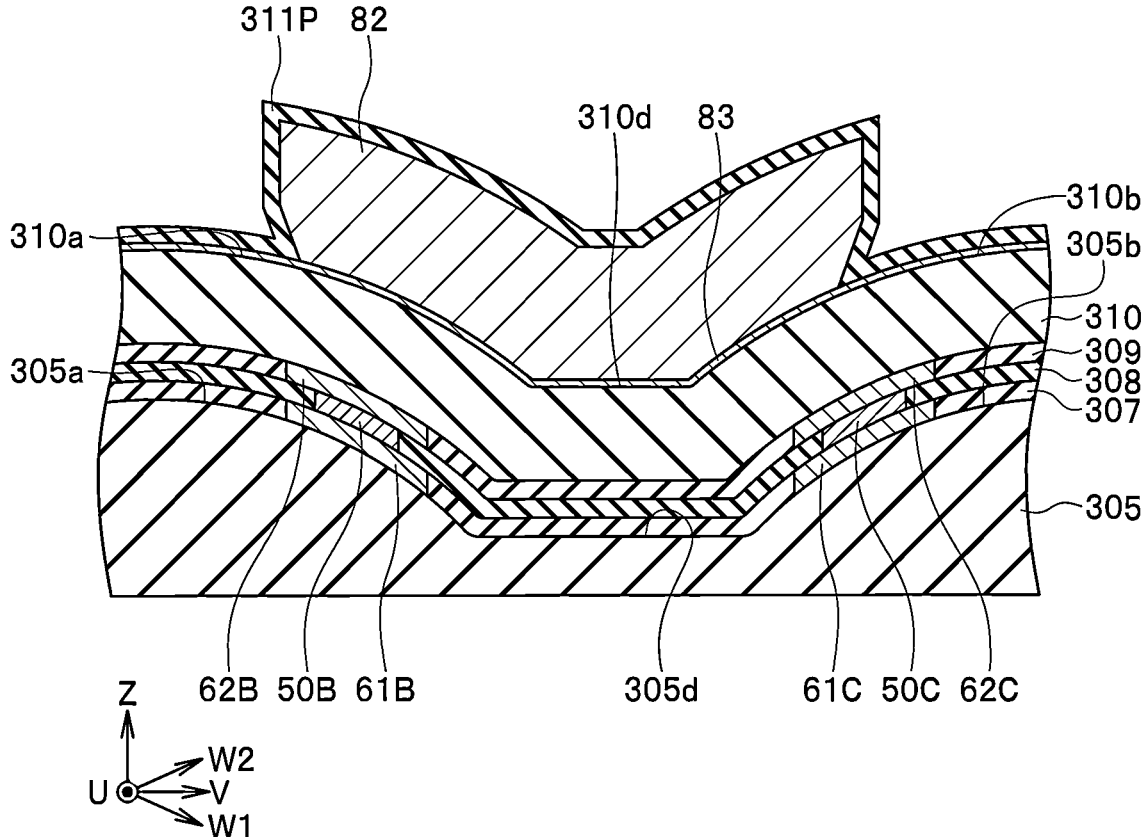
FIG. 13 is a cross-sectional view showing a step that follows the step shown in FIG. 12.

FIG. 13 shows a next step. In this step, an insulating film 311P to become the plurality of first insulating films 311 later is formed so as to cover the plurality of coil elements 82 and the nonmagnetic metal film 83. The insulating film 311P may be formed by atomic layer deposition (ALD), for example. The insulating film 311P covers the respective first side surfaces 82a, the respective second side surfaces 82b, and the respective top surfaces 82d of the plurality of coil elements 82 as well as portions of a top surface of the nonmagnetic metal film 83 not covered with the plurality of coil elements 82.

Figure 14:
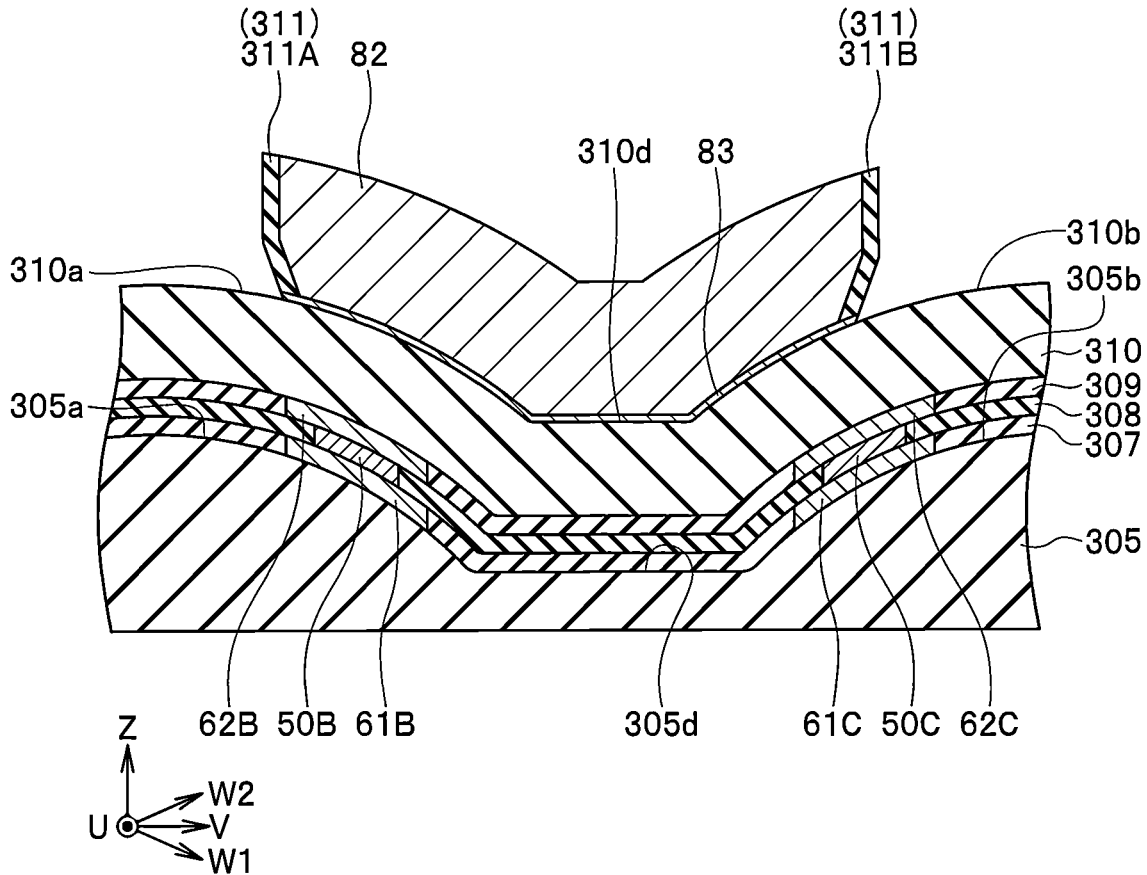
FIG. 14 is a cross-sectional view showing a step that follows the step shown in FIG. 13.

FIG. 14 shows a next step. In this step, the nonmagnetic metal film 83 and the insulating film 311P are etched so that portions of the nonmagnetic film 83 not covered with the plurality of coil elements 82 are removed. For example, ion milling is used for etching the nonmagnetic metal film 83 and the insulating film 311P. Through the etching, a portion of the insulating film 311P covering the top surface 82d of each of the plurality of coil elements 82 and a portion of the insulating film 311P covering the nonmagnetic metal film 83 (excluding a portion near the coil element 82) are removed. Portions of the insulating film 311P that remain intact without being etched become the plurality of first insulating films 311.

Through the etching, the plurality of nonmagnetic films 84 are also formed (see FIGS. 9 and 10). The plurality of nonmagnetic films 84 are reattached films formed as the particles of the nonmagnetic metal film 83, which have been scattered through etching, are attached to the surfaces of the plurality of first insulating films 311.

Through the etching, overetching may be performed to such a degree that each of the plurality of coil elements 82 is slightly etched so that a portion of the insulating film 311P covering the top surface 82d of each of the plurality of coil elements 82 is reliably removed.

Next, a step of forming the second insulating film 312 will be described with reference to FIG. 6. In the method for manufacturing the magnetic sensor 1, after the nonmagnetic metal film 83 and the insulating film 311P are etched, the second insulating film 312 is formed so as to cover the plurality of coil elements 82 and the plurality of first insulating films 311. The second insulating film 312 may be formed by chemical vapor deposition (CVD), for example.

In the method for manufacturing the magnetic sensor 1, after the second insulating film 312 is formed, a plurality of electrode pads and the like are formed so that a pre-sensor portion to become the magnetic sensor 1 later is completed.

After that, a region around the pre-sensor portion is cut so that the magnetic sensor 1 is completed.

Next, operations and effects of the magnetic sensor 1 according to the example embodiment will be described. First, a method for manufacturing a magnetic sensor of a comparative example will be described. The method for manufacturing the magnetic sensor of the comparative example is the same as the method for manufacturing the magnetic sensor 1 according to the present example embodiment up to the step of removing the not-shown photoresist layer used for forming the plurality of coil elements 82. Next, in the method for manufacturing the magnetic sensor of the comparative example, the nonmagnetic metal film 83 is etched so that portions of the nonmagnetic metal film 83 not covered with the plurality of coil elements 82 are removed. Next, the second insulating film 312 is formed so as to cover the plurality of coil elements 82. Steps after that are the same as the corresponding steps of the method for manufacturing the magnetic sensor 1 according to the present example embodiment.

In the magnetic sensor of the comparative example, the plurality of first insulating films 311 of the present example embodiment are not formed. Therefore, in the magnetic sensor of the comparative example, the second insulating film 312 is in direct contact with the first and second side surfaces 82a and 82b of the coil elements 82. As shown in FIGS. 8 to 10, the first portion 82a1 of the first side surface 82a and the first portion 82b1 of the second side surface 82b of each coil element 82 are inclined as described above. The second insulating film 312 is less easily attached to the first portion 82a1 of the first side surface 82a and the first portion 82b1 of the second side surface 82b of the coil element 82 than to the second portion 82a2 of the first side surface 82a and the second portion 82b2 of the second side surface 82b of the coil element 82. Consequently, a seam, which is formed during deposition of the second insulating film 312, is present at a position closer to the coil element 82. If such a seam is present near the coil element 82, a problem would arise such that the coil element 82 corrodes due to, for example, a resist removing solution used for etching in the step of forming electrode pads and the like or used in the step of isolating a plurality of pre-sensor portions from one another.

In contrast, in the present example embodiment, the first portion 82a1 of the first side surface 82a and the first portion 82b1 of the second side surface 82b of each coil element 82 are respectively covered with the first insulating films 311A and 311B. In other words, in the present example embodiment, the second insulating film 312 is not in direct contact with the first portion 82a1 of the first side surface 82a or the first portion 82b1 of the second side surface 82b of each coil element 82. Thereby, according to the present example embodiment, it is possible to prevent corrosion of the coil element 82 due to a resist removing solution that has entered through the seam of the second insulating film 312.

Second Example Embodiment

Figure 15:
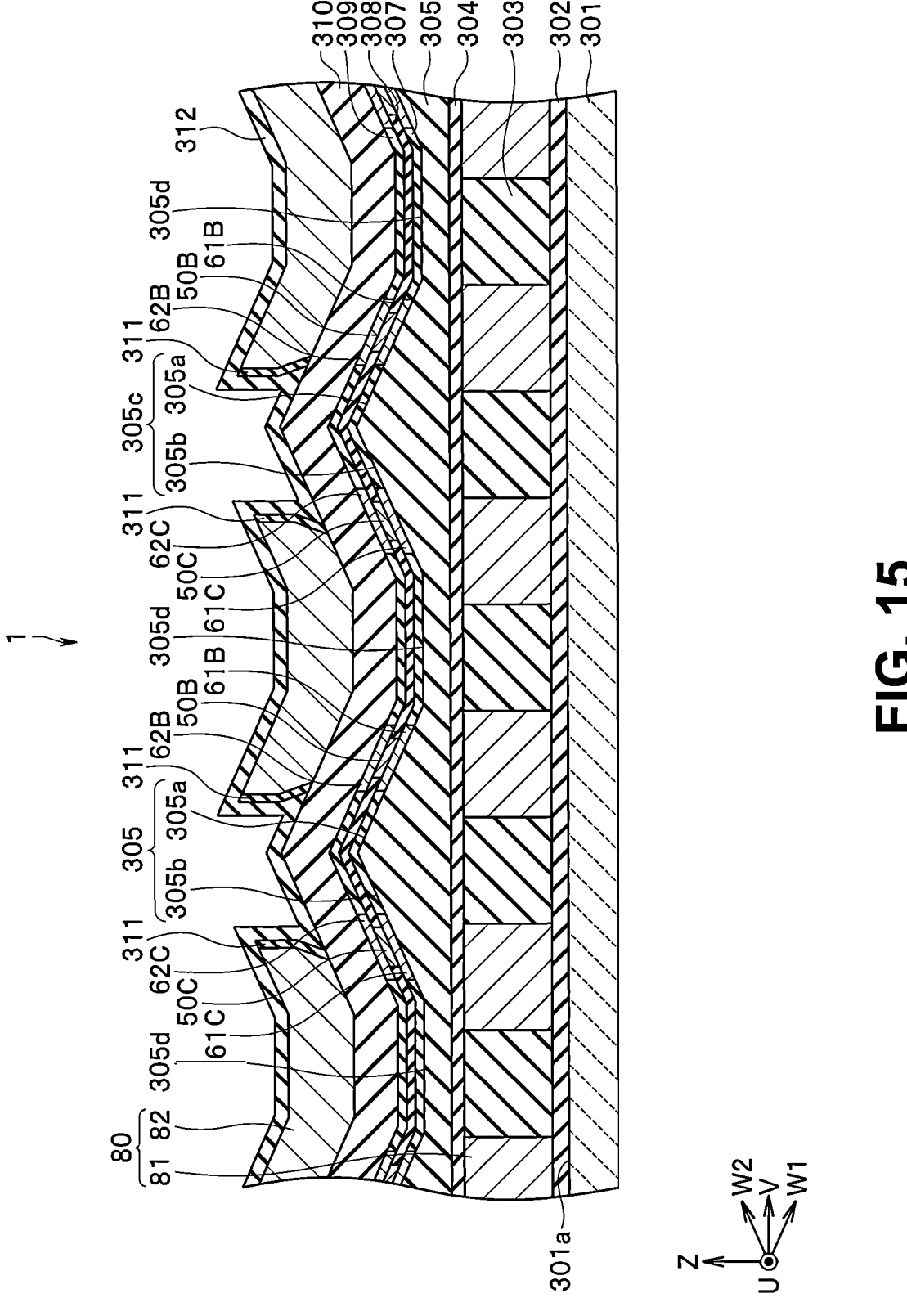
FIG. 15 is a sectional view showing a part of the magnetic sensor according to a second example embodiment of the technology.

A magnetic sensor 1 according to a second example embodiment of the technology will now be described with reference to FIG. 15. FIG. 15 is a sectional view showing a part of the magnetic sensor 1 according to the example embodiment.

In the present example embodiment, each of the plurality of protruding surfaces 305c of the insulating layer 305 has a triangular roof-like overall shape formed by moving the triangular shape of the protruding surface 305c shown in FIG. 15 in the direction parallel to the U direction. All the plurality of first inclined surfaces 305a and the plurality of second inclined surfaces 305b of the insulating layer 305 are flat surfaces. Each of the plurality of first inclined surfaces 305a is a flat surface parallel to the U direction and the W1 direction. Each of the plurality of second inclined surfaces 305b is a flat surface parallel to the U direction and the W2 direction.

Like the example shown in FIG. 6, the insulating layer 305 may include a plurality of protrusions for forming the plurality of protruding surfaces 305c. Alternatively, the insulating layer 305 may include a plurality of slopes arranged in the direction parallel to the V direction. The plurality of slopes each include a first wall surface corresponding to a first inclined surface 305a and a second wall surface corresponding to a second inclined surface 305b. A protruding surface 305c is constituted by the first wall surface of one slope and the second wall surface of another slope adjoining on the −V direction side of the one slope.

In the example shown in FIG. 15, the plurality of slopes each have a bottom surface corresponding to the flat surface 305d. However, the plurality of slopes do not need to have a bottom surface each.

The insulating layer 310 includes a plurality of first inclined surfaces and a plurality of second inclined surfaces. The plurality of first inclined surfaces of the insulating layer 310 are respectively located above the plurality of first inclined surfaces 305a of the insulating layer 305. The plurality of second inclined surfaces of the insulating layer 310 are respectively located above the plurality of second inclined surfaces 305b of the insulating layer 305. The shapes and arrangement of the plurality of first inclined surfaces and the plurality of second inclined surfaces of the insulating layer 310 are similar to the shapes and arrangement of the plurality of first inclined surfaces 305a and the plurality of second inclined surfaces 305b of the insulating layer 305. The description of the plurality of first inclined surfaces 305a and the plurality of second inclined surfaces 305b holds true also for the plurality of first inclined surfaces and the plurality of second inclined surfaces of the insulating layer 310.

The insulating layer 310 further includes a flat surface present around each of the plurality of first inclined surfaces and the plurality of second inclined surfaces. The flat surface is a plane parallel to or almost parallel to the top surface 301a of the substrate 301.

The configuration, operation, and effects of the present example embodiment are otherwise the same as those of the first example embodiment.

The technology is not limited to the foregoing example embodiments, and various modifications may be made thereto. For example, the shape of each coil element 82 is not limited to the example shown in each example embodiment, and may be any shape as long as the requirements of the claims are met. The metal layer of the technology is not limited to a coil element, and may be any wire. The magnetic detection elements of the technology are not limited to MR elements, and may be other elements that detect a magnetic field, such as Hall elements.

The magnetic sensor 1 may further include a third detection circuit configured to detect a component of the target magnetic field in a direction parallel to the XY plane, and generate at least one third detection signal having a correspondence with the component. In such a case, the processor 40 may be configured to generate a detection value corresponding to a component of the target magnetic field in the direction parallel to the U direction based on the at least one third detection signal. The third detection circuit may be integrated with the first and second detection circuits 20 and 30, or may be included in a chip separate from the first and second detection circuits 20 and 30.

As described above, the magnetic sensor of the technology includes a substrate including a reference plane, a magnetic detection element and an insulating layer provided on the substrate, and at least one metal layer and a plurality of first insulating films disposed on the insulating layer. The insulating layer includes at least one inclined surface inclined with respect to the reference plane. The at least one metal layer has a shape that is long in a predetermined direction, and includes a first side surface and a second side surface located on both sides in a short-side direction of the at least one metal layer. Each of the first side surface and the second side surface includes a first portion and a second portion, the second portion being disposed at a position farther from the reference plane than a position where the first portion is disposed. The first portion is inclined so as to intersect with the at least one inclined surface. The first portion of the first side surface is further inclined so as to be closer to the second side surface at positions closer to the reference plane. The first portion of the second side surface is further inclined so as to be closer to the first side surface at positions closer to the reference plane. The plurality of first insulating films include a portion covering the first portion of the first side surface and extending in a direction intersecting with the at least one inclined surface, and a portion covering the first portion of the second side surface and extending in a direction intersecting with the at least one inclined surface.

The magnetic sensor of the technology may further include a second insulating film covering the at least one metal layer and the plurality of first insulating films.

In the magnetic sensor of the technology, the plurality of first insulating films may further include a portion covering the second portion of the first side surface, and a portion covering the second portion of the second side surface.

In the magnetic sensor of the technology, the at least one metal layer may further include a top surface located at a position located forward in a direction away from the reference plane. Each of the plurality of first insulating films may not cover the top surface of the at least one metal layer. The plurality of first insulating films may further include a portion present at a position farther from the reference plane than is a corner portion present at a position where the first side surface and the top surface of the at least one metal layer intersect, and a portion present at a position farther from the reference plane than is a corner portion present at a position where the second side surface and the top surface of the at least one metal layer intersect.

In the magnetic sensor of the technology, the at least one inclined surface may have a shape that is long in one direction parallel to the reference plane. A longitudinal direction of the at least one metal layer and a longitudinal direction of the at least one inclined surface may cross each other.

In the magnetic sensor of the technology, the at least one inclined surface may include a plurality of inclined surfaces. The at least one metal layer may pass through a region above the plurality of inclined surfaces.

In the magnetic sensor of the technology, the at least one metal layer may include two metal layers adjoining in the short-side direction of the at least one metal layer. A gap between the first portion of one of the two metal layers and the first portion of the other of the two metal layers may become larger at positions closer to the reference plane. The two metal layers may be disposed with a predetermined gap between the two metal layers.

The magnetic sensor of the technology may further include a nonmagnetic metal film provided between the at least one metal layer and the at least one inclined surface. A dimension of the nonmagnetic metal film in the short-side direction of the at least one metal layer may be larger than the minimum dimension of the at least one metal layer in the short-side direction of the at least one metal layer.

The magnetic sensor of the technology may further include a plurality of nonmagnetic films attached to respective surfaces of the plurality of first insulating films.

In the magnetic sensor of the technology, the at least one metal layer may be a part of a coil winding.

Obviously, various modification examples and variations of the technology are possible in the light of the above teachings. Thus, it is to be understood that, within the scope of the appended claims and equivalents thereof, the technology may be practiced in other embodiments than the foregoing example embodiments.

What is claimed is:

1. A magnetic sensor comprising:
   a substrate including a reference plane;
   a magnetic detection element and an insulating layer provided on the substrate; and
   at least one metal layer and a first insulating film disposed on the insulating layer, wherein:
   the insulating layer includes at least one inclined surface inclined with respect to the reference plane;
   the at least one metal layer has a shape that is long in a certain direction, and includes a side surface located on an end in a short-side direction of the at least one metal layer;
   the side surface includes a first portion and a second portion, the second portion being disposed at a position farther from the reference plane than a position where the first portion is disposed;
   the first portion is inclined so as to intersect with the at least one inclined surface; and
   the first insulating film includes a portion covering the first portion of the side surface and extending in a direction intersecting with the at least one inclined surface.

2. The magnetic sensor according to claim 1, wherein the at least one metal layer includes a first metal layer and a second metal layer adjoining each other in the certain direction, the first metal layer including a first side surface located on an end in the short-side direction of the first metal layer, the second metal layer including a second side surface located on an end in the short-side direction of the second metal layer, the first side surface and the second side surface facing each other, a gap between the first side surface and the second side surface becomes larger at positions closer to the reference plane.

3. The magnetic sensor according to claim 1, further comprising a second insulating film covering the at least one metal layer and the first insulating film.

4. The magnetic sensor according to claim 1, wherein the first insulating film further includes a portion covering the second portion of the side surface.

5. The magnetic sensor according to claim 1, wherein:
   the at least one metal layer further includes a top surface located at a position located forward in a direction away from the reference plane; and
   the first insulating film does not cover the top surface of the at least one metal layer.

6. The magnetic sensor according to claim 5, wherein the first insulating film further includes a portion present at a position farther from the reference plane than is a corner portion present at a position where the side surface and the top surface of the at least one metal layer intersect.

7. The magnetic sensor according to claim 1, wherein:

the at least one inclined surface has a shape that is long in one direction parallel to the reference plane; and a longitudinal direction of the at least one metal layer and a longitudinal direction of the at least one inclined surface cross each other.

8. The magnetic sensor according to claim 1, wherein the at least one inclined surface includes a plurality of inclined surfaces.

9. The magnetic sensor according to claim 8, wherein the at least one metal layer passes through above the plurality of inclined surfaces.

10. The magnetic sensor according to claim 1, wherein:

the at least one metal layer includes two metal layers adjoining in the short-side direction of the at least one metal layer; and a gap between the first portion of one of the two metal layers and the first portion of another of the two metal layers becomes larger at positions closer to the reference plane.

11. The magnetic sensor according to claim 1, wherein:

the at least one metal layer includes two metal layers adjoining in the short-side direction of the at least one metal layer; and the two metal layers are disposed with a gap between the two metal layers.

12. The magnetic sensor according to claim 1, further comprising a nonmagnetic metal film provided between the at least one metal layer and the at least one inclined surface, wherein a dimension of the nonmagnetic metal film in the short-side direction of the at least one metal layer is larger than a minimum dimension of the at least one metal layer in the short-side direction of the at least one metal layer.

13. The magnetic sensor according to claim 1, further comprising a plurality of nonmagnetic films attached to a surface of the first insulating film.

14. The magnetic sensor according to claim 1, wherein the at least one metal layer is a part of a coil winding.

15. A magnetic sensor comprising:

a substrate including a reference plane;

a magnetic detection element and an insulating layer provided on the substrate; and at least one metal layer and a first insulating film disposed on the insulating layer, wherein:

the insulating layer includes at least one sloping surface that slopes with respect to the reference plane;

the at least one metal layer includes a bottom surface disposed on a side of the at least one sloping surface, a top surface that faces the bottom surface in a thickness direction of the at least one metal layer, and a side surface that connects the bottom surface and the top surface;

a part of the side surface adjacent to the at least one sloping surface is inclined so as to intersect with the at least one sloping surface; and the first insulating film covers at least a part where the part of the side surface and the bottom surface are connected.

* * * * *